United States Patent
Stachler

(10) Patent No.: US 8,171,352 B2
(45) Date of Patent: May 1, 2012

(54) HVAC SYSTEM, A METHOD FOR DETERMINING A SOURCE OF A RESET AND A HVAC CONTROLLER CONFIGURED FOR THE SAME

(75) Inventor: John P. Stachler, Plano, TX (US)

(73) Assignee: Lennox Industries Inc., Richardson, TX (US)

( * ) Notice: Subject to any disclaimer, the term of this patent is extended or adjusted under 35 U.S.C. 154(b) by 46 days.

(21) Appl. No.: 12/694,486

(22) Filed: Jan. 27, 2010

(65) Prior Publication Data

US 2010/0299563 A1   Nov. 25, 2010

Related U.S. Application Data

(60) Provisional application No. 61/180,405, filed on May 21, 2009.

(51) Int. Cl.
*G06F 11/00* (2006.01)
(52) U.S. Cl. ............................................. 714/55; 714/23
(58) Field of Classification Search ...................... 714/55
See application file for complete search history.

(56) References Cited

U.S. PATENT DOCUMENTS

| | | | | |
|---|---|---|---|---|
| 5,729,675 A * | 3/1998 | Miller et al. | | 714/36 |
| 5,960,195 A * | 9/1999 | Kang et al. | | 713/1 |
| 6,317,827 B1 * | 11/2001 | Cooper | | 713/2 |
| 6,711,675 B1 * | 3/2004 | Spiegel et al. | | 713/2 |
| 6,813,672 B1 * | 11/2004 | Kamran et al. | | 710/305 |
| 7,299,346 B1 * | 11/2007 | Hollis | | 713/2 |
| 2003/0052180 A1 * | 3/2003 | Huhn et al. | | 236/49.3 |
| 2005/0213761 A1 * | 9/2005 | Walmsley et al. | | 380/255 |
| 2006/0114627 A1 * | 6/2006 | Wong | | 361/42 |
| 2009/0063799 A1 * | 3/2009 | Berenbaum et al. | | 711/163 |
| 2009/0113194 A1 * | 4/2009 | Orita et al. | | 713/1 |
| 2010/0211824 A1 * | 8/2010 | Agrawal et al. | | 714/23 |

* cited by examiner

*Primary Examiner* — Robert Beausoliel, Jr.
*Assistant Examiner* — Neil Miles

(57) ABSTRACT

An HVAC controller, a method for determining the source of a reset of a HVAC unit and a HVAC system are disclosed herein. In one embodiment, the HVAC controller includes: (1) a power on reset (POR) register configured to indicate if a POR has occurred for said controller, (2) a non-volatile memory having a first reset code section and a second reset code section, wherein said first and second reset code sections are each configured to store a reset code and (3) a processor configured to deduce when a source of a reset for said controller is a watchdog reset based on content of said POR register, said first reset code section and said second reset code section.

14 Claims, 2 Drawing Sheets

HVAC SYSTEM, A METHOD FOR DETERMINING A SOURCE OF A RESET AND A HVAC CONTROLLER CONFIGURED FOR THE SAME

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to heating, ventilating and air conditioning (HVAC) systems and, more specifically, to determining the source of a reset of an HVAC system.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as rooftop units, may be used to provide conditioned air for enclosed spaces.

Each HVAC unit typically includes a HVAC controller that directs the operation of the HVAC unit. The HVAC controller may also monitor the operation of the HVAC unit. Accordingly, the HVAC controller may respond to a reset condition and initiate a reset of the HVAC unit by, for example, generating a reset signal.

Various conditions or events may cause an HVAC controller to initiate a reset of a HVAC unit. A power on reset (POR) is example of a condition or an event that initiates a reset. Typically, a POR initiates a reset when power is applied to the HVAC controller. The POR may be used to ensure that the HVAC controller starts operating at a known address or a known state.

A scheduled reset may also initiate a reset. A scheduled reset occurs during normal operation of the HVAC unit in response to a defined condition or event. For example, a manual reset may occur when a designated button is activated (e.g., depressed or touched) for a predetermined amount of time. Other type of scheduled resets, for example, may include a hardware failure with an external clock source, a low voltage condition or an external interrupt.

Other types of conditions or events may also initiate a reset. A watchdog reset, for example, may occur due to a fault condition that may be potentially dangerous to the HVAC unit. A watchdog timer may be used to initiate a reset if a program of the HVAC controller due to some fault condition, such as a hang state, neglects to regularly service the watchdog timer. The watchdog timer may be regularly serviced by writing a service pulse thereto. The intention of a watchdog reset is to bring the HVAC controller back from a hung state into normal operation.

SUMMARY

In one aspect, an HVAC controller is disclosed. In one embodiment, the HVAC controller includes: (1) a power on reset (POR) register configured to indicate if a POR has occurred for the controller, (2) a non-volatile memory having a first reset code section and a second reset code section, wherein the first and second reset code sections are each configured to store a reset code and (3) a processor configured to deduce when a source of a reset for the controller is a watchdog reset based on content of the POR register, the first reset code section and the second reset code section.

In another aspect, a method determining a reset source for a HVAC unit is disclosed. In one embodiment, the method includes: (1) receiving a reset signal at a controller of the HVAC unit and (2) deducing if a source of the reset signal is a watchdog reset based on content of a power on reset (POR) register, a first reset code section and a second reset code section of the controller, the deducing performed by a processor of the controller.

In yet another aspect, a HVAC system is provided. In one embodiment, the HVAC system includes: (1) heating, cooling and blowing (HCB) components and (2) a controller coupled to the HCB components and configured to manage operation thereof, the controller having: (2A) a power on reset (POR) register configured to indicate if a POR has occurred for the controller, (2B) a non-volatile memory having a first reset code section and a second reset code section, wherein the first and second reset code sections are each configured to store a reset code; and (3) a processor configured to deduce when a source of a reset for the controller is a watchdog reset based on content of the POR register, the first reset code section and the second reset code section.

BRIEF DESCRIPTION

Reference is now made to the following descriptions taken in conjunction with the accompanying drawings, in which.

DETAILED DESCRIPTION

This disclosure provides embodiments for determining the source of a reset in a HVAC unit. As such, when a HVAC controller initiates a reset, disclosed herein are embodiments that determine if the source of the reset is a watchdog reset. When the HVAC controller determines a watchdog reset occurs, the HVAC controller can then assume that a normal operation reset (i.e., a reset defined in a reset schedule) did not occur. Thus, in contrast to conventional HVAC controllers, the occurrence of a watchdog reset may be determined by the HVAC controllers disclosed herein. By determining that a reset is a watchdog reset, the HVAC controller or a user, such as a HVAC technician, can assume that a scheduled reset or POR did not occur. Thus, assumptions can be made that, for example, there is no hardware failure with an external clock source, there is no low voltage condition, or no external interrupt was used. Accordingly, the disclosure may provide assistance to the HVAC technician in determining the cause of a reset for an HVAC unit and, therefore, improve troubleshooting of HVAC units.

Typically, each HVAC unit will include a designated controller. An HVAC controller may be one or more electric circuit boards including at least one micro-processor or micro-controller integrated circuit. The HVAC controller also includes the support circuitry for power, signal conditioning, and associated peripheral devices. In addition to a processor, the HVAC controller may include a memory having a program or series of operating instruction (i.e., firmware or software) that executes in such a way as to implement the features described herein when initiated by the processor. Additionally, the processor is configured to provide control functionality beyond the scope of the present disclosure.

Figure 1:
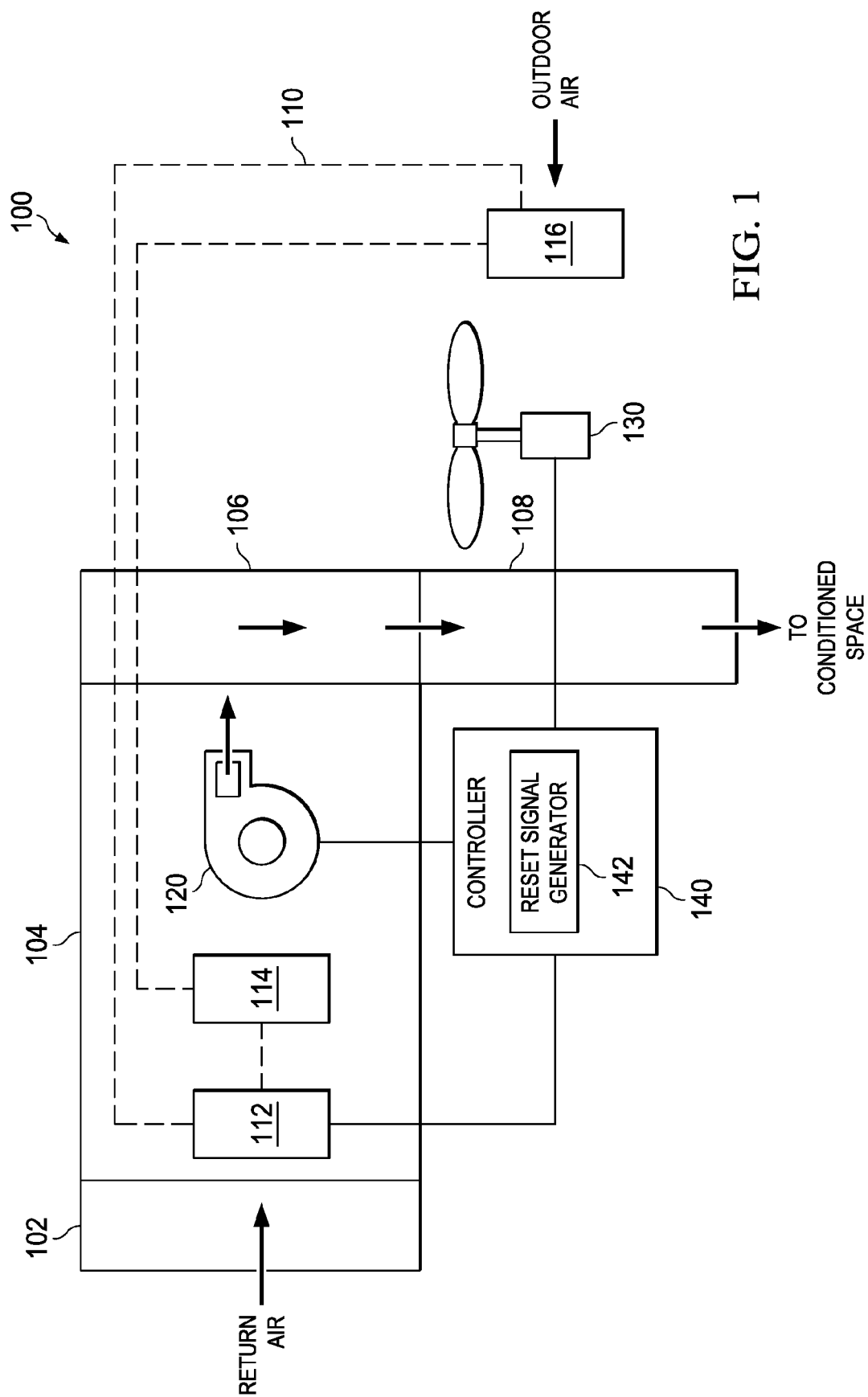
FIG. 1 is a block diagram of an embodiment of a HVAC system constructed according to the principles of the disclosure.

FIG. 1 is a block diagram of an embodiment of a HVAC unit 100 constructed according to the principles of the disclosure. The HVAC unit 100 includes a return duct 102, a return plenum 104, a supply duct 106 and a supply plenum 108. Additionally, the HVAC unit 100 includes a refrigeration circuit 110, an indoor air blower 120, an outdoor fan 130 and a HVAC controller 140. The refrigeration circuit 110 includes a compressor system 112, evaporator coils 114 and condenser coils 116. Each of the components of the refrigeration circuit 110 is fluidly coupled together. The refrigeration system 110 represents a single cooling stage of the HVAC unit 100. Given the teachings herein, one skilled in the art will understand that this disclosure also applies to other HVAC embodiments having more than one cooling stage.

Given the teachings herein, one skilled in the art will also understand that the HVAC unit 100 may include additional components and devices that are not presently illustrated or discussed but are typically included in an HVAC system, such as, a power supply, an expansion valve, a temperature sensor, a humidity sensor, an electrical heating element, etc. A thermostat (not shown) is also typically employed with the HVAC unit 100 and used as a user interface. The various illustrated components of the HVAC unit 100 may be contained within a single enclosure (e.g., a cabinet). In one embodiment, the HVAC unit 100 is a rooftop unit.

The refrigeration circuit 110, the indoor air blower 120 and the outdoor fan system 130 may be conventional devices that are typically employed in HVAC systems. At least some of the operation of the HVAC unit 100 can be controlled by the HVAC controller 140 based on inputs from various sensors of the HVAC unit 100 including a temperature sensor or a humidity sensor. For example, the HVAC controller 140 can cause the indoor air blower 120 to move air across the evaporator coils 114 and into an enclosed space.

The HVAC controller 140 may include a processor, such as a microprocessor, configured to direct the operation of the HVAC unit 100. Additionally, the HVAC controller 140 may include an interface and a memory coupled thereto. The interface may include multiple ports for transmitting and receiving data. The ports may be conventional receptacles for communicating data via various means such as, a portable memory device, a PC or portable computer or a communications network. The memory section may be a conventional memory that is constructed to store data and computer programs.

As illustrated in FIG. 1, the HVAC controller 140 is coupled to the various components of the HVAC unit 100. In some embodiments, the connections therebetween are through a wired-connection. A conventional cable and contacts may be used to couple the HVAC controller 140 to the various components of the HVAC unit 100. In other embodiments, a wireless connection may also be employed to provide at least some of the connections.

The controller 140 is configured to generate a reset signal for the HVAC unit. Additionally, the controller 140 is configured to determine the source of reset. The source of the reset may be, for example, a POR, a scheduled reset or a watchdog reset. The controller 140 may determine that a reset is a watchdog reset. More detail of a controller for a HVAC unit is illustrated and discussed with respect to FIG. 2.

Figure 2:
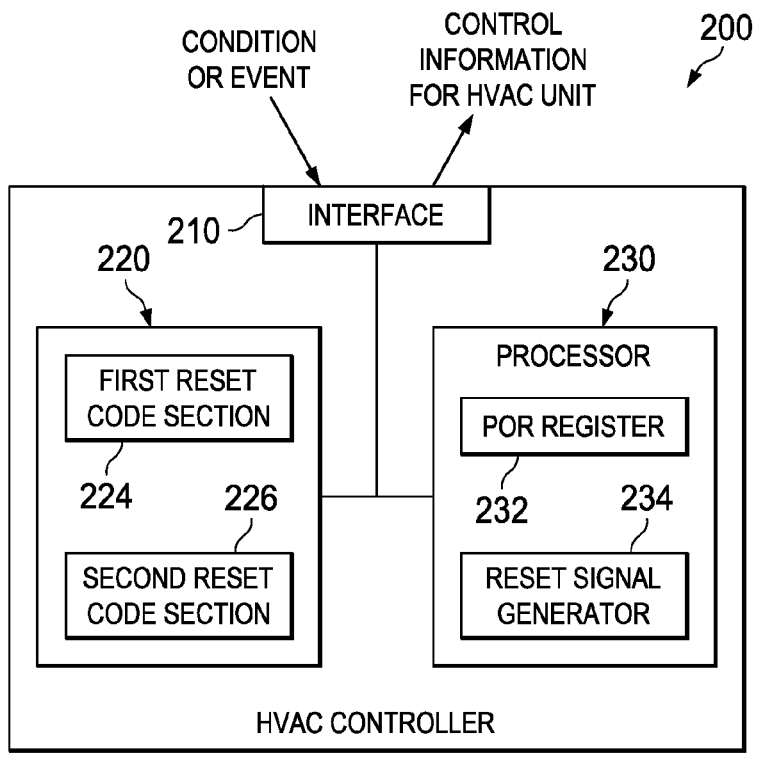
FIG. 2 is a block diagram of an embodiment of a HVAC controller constructed according to the principles of the disclosure.

FIG. 2 is a block diagram of an embodiment of a HVAC controller 200 constructed according to the principles of the disclosure. The HVAC controller includes an interface 210, a memory 220 and a processor 230. The HVAC controller 200 may also include additional components typically included within a controller for a HVAC system, such as a power supply or power port. The HVAC controller 200 is configured to direct the operation of a HVAC unit, such as a rooftop HVAC unit.

The interface 210 may be a conventional interface that is used to receive and transmit data for a controller, such as a micro-controller. The interface 210 is configured to receive signals indicating conditions or events associated with the HVAC unit. The signals may be associated with scheduled resets for the HVAC unit.

The interface 210 may be a conventional device for transmitting and receiving data and may include multiple ports for transmitting and receiving data. The ports may be conventional receptacles for communicating data via various means such as, a portable memory device, a PC or portable computer or a communications network. The interface 210 is coupled to the memory 220 and the processor 230.

The memory 220 may be a conventional memory typically located within a microcontroller that is constructed to store data and computer programs. The memory 220 may store operating instructions to direct the operation of the processor 230 when initiated thereby. The memory 220 is a non-volatile memory and includes a first reset code section 224 and a second reset code section 226. The first and second reset code sections 224, 226, are dedicated locations of the memory 220 that are configured to store a reset code. Reset codes are used by the HVAC controller 200 to indicate a type of scheduled reset. Each scheduled reset may have a unique reset code.

The processor 230 may be a conventional processor such as a microprocessor. The processor 230 includes a POR register 232 and a reset signal generator 234. The POR register 232 is a temporary storage in the processor 230. The POR register 232 may be, for example, a flag register of the processor 230. The POR register 232 is configured to indicate if a POR has occurred for the HVAC controller 200. For example, the POR register 232 may store a logical one if a POR has occurred (i.e., the POR register 232 has been set) and a logical zero if a POR has not occurred.

The reset signal generator 234 is configured to generate a reset signal for the HVAC controller 200 when reset condition or event occurs for the HVAC unit. A signal indicating the occurrence of a reset condition or event may be received by the reset signal generator 234 via the interface 210. For some embodiments, a signal indicating the occurrence of a reset condition or event may be generated internally from the processor 230 and sent to the reset signal generator 234.

The processor 230 is configured to determine when a source of a reset for the HVAC controller 200 is a watchdog reset based on content of the POR register 232, the first reset code section 224, which is cleared at start-up after contents are read, and the second reset code section 226. In one embodiment, the processor 230 is configured to set the POR register (establish a logical one in the POR register) when a POR occurs. The processor 230 may also be configured to store a reset code in both the first and second reset code sections 224, 226, when a scheduled reset occurs. The reset code represents the type of scheduled reset for the HVAC controller 200. Thus, when a scheduled reset occurs, the same reset code is written in two locations of the memory 220, the first reset code section 224 and the second reset code section 226. Additionally, the processor 230 may be configured to determine if the POR register 232 is set at a first start-up of the HVAC controller 200 subsequent the reset. At the first start-up, the processor 230 may also determine if a first reset code in the first reset code section 224 is equivalent to a second reset code in the second reset code section 226. In other words, the processor 230 may determine if the same reset code is stored in both the first reset code section 224 and the second reset code section 226. The processor 230 may then determine that a reset is a watchdog reset when the POR register is not set and the first reset code is not equivalent to the second reset code. When the POR register 232 is set, the reset was a POR. Additionally, if the POR register 232 was not set and the same reset code is stored in the first reset code section 224 and the second reset code section 226, then the reset was a scheduled reset with the type indicated by the stored reset code.

Figure 3:
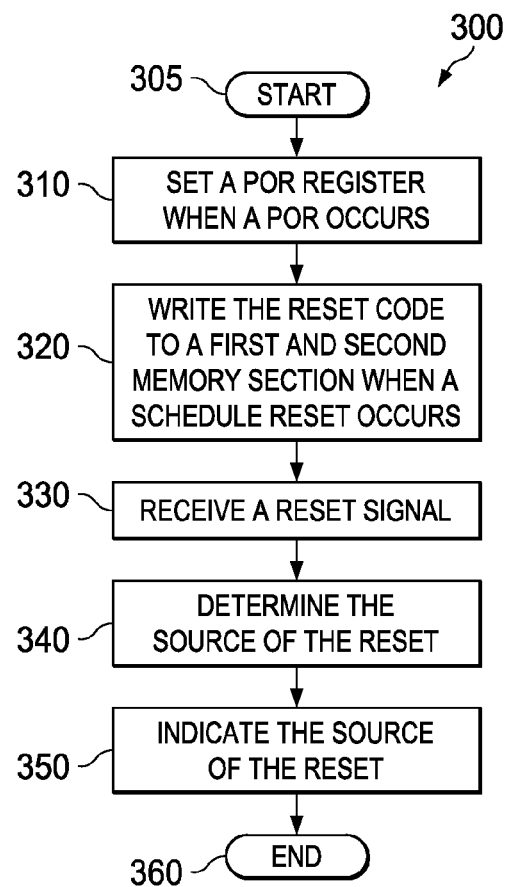
FIG. 3 is a flow diagram of an embodiment of a method of determining the reset source for a HVAC unit carried out according to the principles of the disclosure.

FIG. 3 is a flow diagram of an embodiment of a method 300 of determining the reset source for a HVAC unit carried out according to the principles of the disclosure. The HVAC unit may include a refrigeration circuit, an indoor air blower system an outdoor fan system and a heating element. An HVAC controller such as described with respect to FIG. 1 or FIG. 2 may be used to perform the method 300. The method 300 may represent an algorithm that is stored on a computer readable medium, such as a memory of an HVAC controller (e.g., the memory 220 of FIG. 2) as a series of operating instructions that can direct the operation of a processor (e.g., the processor 230 of FIG. 2). The method 300 begins in a step 305.

In a step 310, a POR register of a HVAC controller is set when a POR occurs for the HVAC controller. The POR register may be set by the HVAC controller to a logical one. The HVAC controller may set the POR register based on receiving a signal indicating a POR.

A reset code, representing a scheduled reset, is stored in both a first and a second reset code section in a step 320 when the scheduled reset occurs for the HVAC controller. Thus, when a schedule reset occurs, the same reset code is stored in two designated reset code sections of a memory associated with HVAC controller. The HVAC controller may direct storing the reset code. More particularly, a processor of the HVAC controller may coordinate storing the reset code.

In a step 330, a reset signal is received. Thereafter, a determination is made in a step 340 if a source of the reset signal is a watchdog reset. In one embodiment the HVAC controller may deduce if the reset source is a watchdog reset based on content of a POR register, a first reset code section and a second reset code section of the HVAC controller. When determining the source, the POR register may be checked to see if it is set. Additionally, the first reset code section and the second reset code section can be checked to see if the same reset code is stored in each section. The determination may be made at a first start-up of the HVAC controller subsequent to receipt of the reset signal. The occurrence of a watchdog reset may be when the POR register is not set and the first reset code is not equivalent to the second reset code.

The source of the reset is then indicated in a step 350. An indication light at the HVAC unit may be illuminated to alert a technician to the type of reset that occurred. Additionally, the type of reset may be transmitted or downloaded via a HVAC interface to a HVAC technician for further analysis. The method 300 then ends in a step 360.

The above-described methods or at least part thereof may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as dedicated HVAC controller, may be designed to include the necessary circuitry to perform at least some of the steps of the methods of FIG. 3.

Those skilled in the art to which this application relates will appreciate that other and further additions, deletions, substitutions and modifications may be made to the described embodiments.

What is claimed is:

1. A controller for a heating, ventilating and air conditioning (HVAC) unit, comprising:
a power on reset (POR) register configured to indicate if a POR has occurred for said controller;
a non-volatile memory having a first reset code section and a second reset code section, wherein said first and second reset code sections are each configured to store a reset code that is used to indicate a type of scheduled reset for said controller; and
a processor configured to deduce when a source of a reset for said controller is a watchdog reset based on content of said POR register, said first reset code section and said second reset code section, said processor further configured to set said POR register when said POR occurs and store said reset code in both said first and second reset code sections in response to when said type of scheduled reset occurs for said controller.

2. The HVAC controller as recited in claim 1 wherein said processor is configured to determine said source at a first start-up of said controller subsequent said reset.

3. The HVAC controller as recited in claim 1 wherein said processor determines if said POR register is set at a first start-up of said controller subsequent said reset.

4. The HVAC controller as recited in claim 3 wherein said processor determines if a first reset code in said first reset code section is equivalent to a second reset code in said second reset code section at a first start-up of said controller subsequent said reset.

5. The HVAC controller as recited in claim 4 wherein said processor is configured to determine said source is said watchdog reset when said POR register is not set and said first reset code is not equivalent to said second reset code.

6. A method for determining the source of a reset for a heating, ventilating and air conditioning (HVAC) unit, said method comprising:
receiving a reset signal at a controller of said HVAC unit;
deducing if a source of said reset signal is a watchdog reset based on content of a power on reset (POR) register, a first reset code section and a second reset code section of said controller, said deducing performed by a processor of said controller;
determining if said POR register is set at a first start-up of said controller subsequent receipt of said reset signal; and
determining if a first reset code in said first reset code section is equivalent to a second reset code in said second reset code section at a first start-up of said controller subsequent receipt of said reset signal.

7. The method of claim 6 further comprising setting said POR register when a POR occurs for said controller.

8. The method of claim 7 further comprising storing a reset code that is used to indicate a type of scheduled reset for said controller in both said first and second reset code sections in response to when said type of scheduled reset occurs for said controller.

9. The method of claim 6 wherein said deducing occurs at a first start-up of said controller subsequent said reset.

10. The method of claim 6 further comprising determining said source is said watchdog reset when said POR register is not set and said first reset code is not equivalent to said second reset code.

11. A heating, ventilating and air conditioning (HVAC) unit, comprising:
  heating, cooling and blowing (HCB) components; and
  a controller coupled to said HCB components and configured to manage operation thereof, said controller having:
    a power on reset (POR) register configured to indicate if a POR has occurred for said controller;
    a non-volatile memory having a first reset code section and a second reset code section, wherein said first and second reset code sections are each configured to store a reset code that is used to indicate a type of scheduled reset for said controller; and
    a processor configured to deduce when a source of a reset for said controller is a watchdog reset based on content of said POR register, said first reset code section and said second reset code section, said processor further configured to set said POR register when said POR occurs and store said reset code in both said first and second reset code sections in response to when said type of scheduled reset occurs for said controller.

12. The HVAC unit as recited in claim 11 wherein said processor determines if said POR register is set at a first start-up of said controller subsequent said reset.

13. The HVAC unit as recited in claim 12 wherein said processor determines if a first reset code in said first reset code section is equivalent to a second reset code in said second reset code section at a first start-up of said controller subsequent said reset.

14. The HVAC unit as recited in claim 13 wherein said processor is configured to determine said source is said watchdog reset when said POR register is not set and said first reset code is not equivalent to said second reset code.

\* \* \* \* \*